(12) United States Patent
Iida (10) Patent No.: US 11,824,036 B2
(45) Date of Patent: Nov. 21, 2023

(54) SEMICONDUCTOR DEVICE (71) Applicant: KIOXIA CORPORATION, Tokyo (JP)

(72) Inventor: Akihiro Iida, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 125 days.

(21) Appl. No.: 17/459,388

(22) Filed: Aug. 27, 2021

(65) Prior Publication Data

US 2022/0302076 A1 Sep. 22, 2022

(30) Foreign Application Priority Data

Mar. 22, 2021 (JP) ................. 2021-047206

(51) Int. Cl.
H01L 23/00 (2006.01)
H01L 25/065 (2023.01)

(52) U.S. Cl.
CPC .............. *H01L 24/49* (2013.01); *H01L 24/48* (2013.01); *H01L 25/0655* (2013.01); *H01L 2224/4801* (2013.01); *H01L 2224/48227* (2013.01); *H01L 2224/49109* (2013.01)

(58) Field of Classification Search
CPC ...................................... H01L 23/36
See application file for complete search history.

(56) References Cited

U.S. PATENT DOCUMENTS

| 6,843,421 | B2 | 1/2005 | Chhor et al. |
| 9,153,519 | B2 | 10/2015 | Nagaune |
| 2008/0315382 | A1 | 12/2008 | Wallace |
| 2010/0110647 | A1 | 5/2010 | Hiew et al. |
| 2018/0233642 | A1 | 8/2018 | Chen et al. |
| 2021/0159213 | A1* | 5/2021 | Kim ............... H01L 25/0652 |

FOREIGN PATENT DOCUMENTS

| JP | 2019-121612 A | 7/2019 |
| TW | 201830737 A | 8/2018 |

* cited by examiner

*Primary Examiner* — Yu-Hsi D Sun
(74) *Attorney, Agent, or Firm* — Kim & Stewart LLP (57) ABSTRACT A semiconductor device includes a printed circuit board having a plurality of first electrode pads on a first main surface and a plurality of second electrode pads electrically connected to at least one of the plurality of first electrode pads on a second main surface, a first chip disposed on the first main surface and having a non-volatile memory; a second chip having a third electrode pad and a control circuit configured to control an operation of the non-volatile memory, a dummy chip having a component that has a higher thermal conductivity than a substrate of the second chip, and a sealing member sealing the first, second, and dummy chips. The third electrode pad is connected to the component of the dummy chip via a first wiring, and the component of the dummy chip is connected to one of the plurality of first electrode pads via a second wiring.

20 Claims, 6 Drawing Sheets

SEMICONDUCTOR DEVICE

CROSS-REFERENCE TO RELATED APPLICATION

This application is based upon and claims the benefit of priority from Japanese Patent Application No. 2021-047206, filed Mar. 22, 2021, the entire contents of which are incorporated herein by reference.

FIELD

Embodiments described herein relate generally to a semiconductor device.

BACKGROUND

One type of a semiconductor device has a non-volatile memory chip and a controller chip in which a control circuit for controlling the non-volatile memory, and the two chips are sealed. As the operation speed of such a semiconductor device is increased, the temperature of the control circuit is significantly increased.

DETAILED DESCRIPTION

Embodiments provide a semiconductor device capable of preventing a temperature rise of a control circuit.

In general, according to one embodiment, there is provided a semiconductor device including: a printed circuit board having a plurality of first electrode pads on a first main surface and a plurality of second electrode pads electrically connected to at least one of the plurality of first electrode pads on a second main surface, wherein the first main surface and the second main surface are respectively located on opposite sides of the printed circuit board; a first chip disposed on the first main surface and having a non-volatile memory; a second chip having a third electrode pad and a control circuit configured to control an operation of the non-volatile memory; a dummy chip having a component that has a higher thermal conductivity than a substrate of the second chip, and a sealing member sealing the first, second, and dummy chips. The third electrode pad is connected to the component of the dummy chip via a first wiring, and the component of the dummy chip is connected to one of the plurality of first electrode pads via a second wiring.

Hereinafter, the present disclosure will be described in detail with reference to the drawings. It is noted that the present disclosure is not limited to the following embodiments. In addition, components in the following embodiments may be substituted by ones that can be easily conceived by those skilled in the art or by ones that are substantially the same.

First Embodiment

Hereinafter, a first embodiment will be described in detail with reference to the drawings.

Example of Functional Configuration of Semiconductor Device

Figure 1:
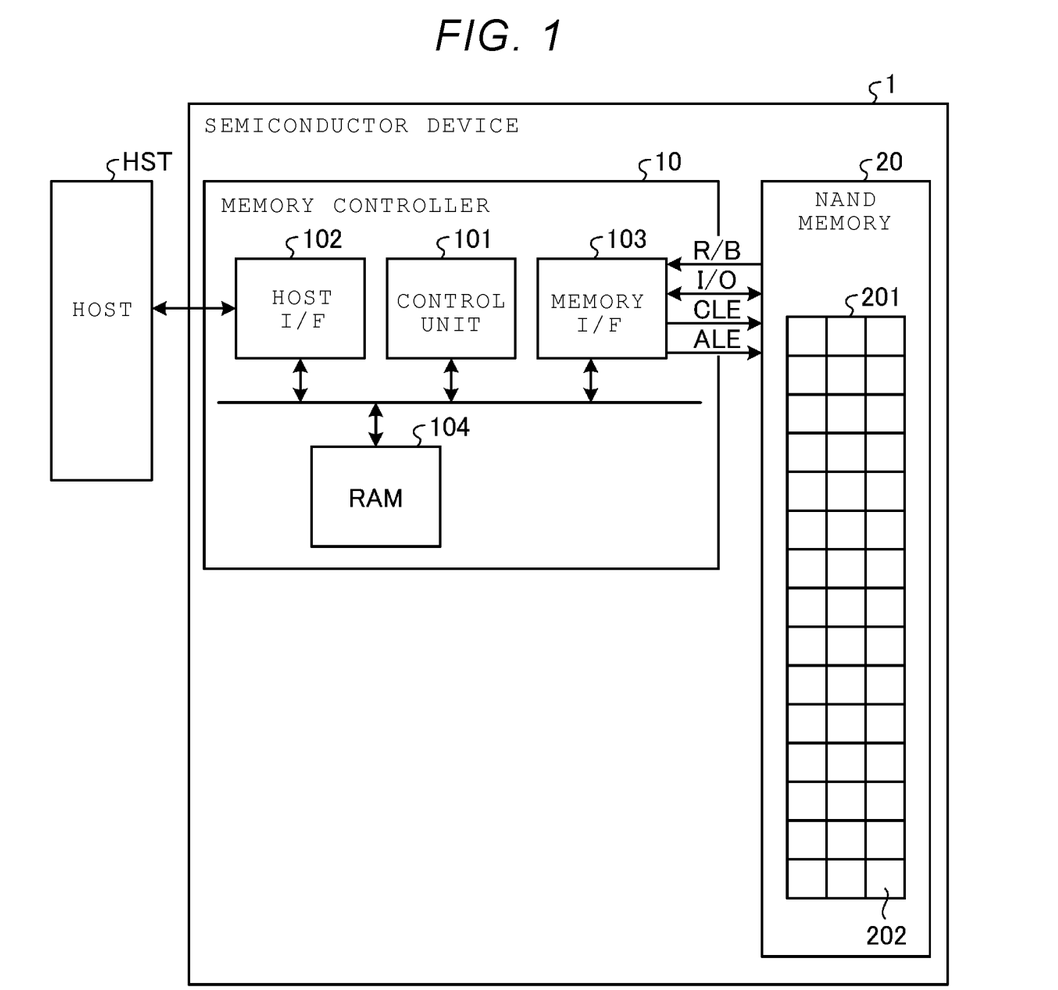
FIG. 1 is a block diagram illustrating an example of a functional configuration of a semiconductor device according to a first embodiment.

FIG. 1 is a block diagram illustrating an example of a functional configuration of a semiconductor device 1 according to the first embodiment. As illustrated in FIG. 1, the semiconductor device 1 includes a memory controller 10 and NAND flash memory 20 (hereinafter, also simply referred to as NAND memory 20).

The semiconductor device 1 is configured, for example, as a memory card in which the memory controller 10 and the NAND memory 20 are configured as one package. However, the semiconductor device 1 may be a solid state drive (SSD) or the like. The semiconductor device 1 can be connected to a host HST. The host HST may be, for example, an information processing device such as a personal computer, a server, or a storage box, a mobile phone, and an imaging device, may be a mobile terminal such as a tablet computer or a smartphone, may be a game device, and may be an in-vehicle terminal of a car navigation system or the like.

The NAND memory 20 is one type of non-volatile memory that stores data in a non-volatile manner. However, the semiconductor device 1 may be other types of non-volatile memory. For example, the non-volatile memory may be any of various storage media such as a NOR type flash memory, a three-dimensional structure flash memory, a resistance random access memory (ReRAM), and a ferroelectric random access memory (FeRAM). In addition, it is not essential that the non-volatile memory is a semiconductor memory, and various storage media other than the semiconductor memory may be used.

The NAND memory 20 includes a memory cell array 201 in which a plurality of memory cells are arranged in a matrix configuration. The data from the host HST is stored in individual memory cells in the memory cell array 201 in a non-volatile manner. The memory cell array 201 has a plurality of blocks 202, each containing the plurality of memory cells.

As described above, the block 202 is a set of non-volatile memory cells. The number of blocks 202 in the memory cell array 201 may be selected to be any number. Generally, in the NAND memory 20, data is collectively erased in units of block 202, and writing and reading are performed in units of a page.

In the present specification, the plurality of memory cells connected to the same word line are referred to as a memory cell group. When the memory cell is a single level cell (SLC) which stores one bit, one memory cell group corresponds to one page. When the memory cell is a multi-level cell (MLC) which stores multiple values (data of 2 bits or more), one memory cell group corresponds to a plurality of pages. Each memory cell can be identified by an address that identifies a word line and an address that identifies a bit line.

It is noted that the NAND memory 20 may include peripheral circuits such as a row decoder and a sense amplifier in addition to the memory cell array 201. The row decoder specifies an area of the memory cell array 201 that is an operation target such as a read target or a write target. The sense amplifier senses the data stored by the memory cell that is the read target.

The memory controller 10 functions as a control circuit and is a semiconductor integrated circuit configured as, for example, a system-on-a-chip (SoC). However, the memory controller 10 may be configured as a field-programmable gate array (FPGA) or an application specific integrated circuit (ASIC).

The memory controller 10 controls operations of NAND memory 20. That is, the memory controller 10 controls the writing of data to the NAND memory 20 according to a write request from the host HST. In addition, the memory controller 10 controls the reading of data from the NAND memory 20 according to a read request from the host HST.

In order to implement the above-described functions, the memory controller 10 includes a control unit 101, a host interface (host I/F) circuit 102, a memory interface (memory I/F) circuit 103, and RAM 104. The control unit 101, the host I/F circuit 102, the memory I/F circuit 103, and the RAM 104 are connected to each other via an internal bus.

The host I/F circuit 102 performs processes according to an interface standard such as serial-attached SCSI (SAS®), serial ATA (SATA®), PCI express (PCIe®), and NVM express (NVMe®) with the host HST and outputs the request received from the host HST, the data (user data) to be written, or the like to the internal bus. In addition, the host I/F circuit 102 transmits the data (user data) read from the NAND memory 20 and the response from the control unit 101, and the like to the host HST. It is noted that the control unit 101 described later may have some or all of the functions of the host I/F circuit 102. That is, the control unit 101 may directly perform exchanging of information with the host HST.

The memory I/F circuit 103 performs exchanging of various signals such as a ready/busy signal R/B, an input/output signal I/O, a command latch enable signal CLE, and an address latch enable signal ALE, based on the instruction of the control unit 101 with the NAND memory 20. The ready/busy signal R/B represents whether or not the NAND memory 20 is in a state where the NAND memory can receive a command from the memory controller 10. The input/output signal I/O is a data signal transmitted/received between the NAND memory 20 and the memory controller 10 and is an 8-bit-unit signal indicating a command, an address, a write data, a read data, and the like. The command latch enable signal CLE notifies the NAND memory 20 that the input/output signal I/O contains a command. The address latch enable signal ALE notifies the NAND memory 20 that the input/output signal I/O contains an address.

By transmitting and receiving these signals, the memory I/F circuit 103 performs writing and erasing of the data to and from the NAND memory 20 based on the instruction of the control unit 101. In addition, the memory I/F circuit 103 performs reading of the data from the NAND memory 20 based on the instruction of the control unit 101. It is noted that the control unit 101 described later may have some or all of the functions of the memory I/F circuit 103. That is, the control unit 101 may directly perform exchanging of information with the NAND memory 20.

The control unit 101 is, for example, a central processing unit (CPU). The control unit 101 operates based on a firmware program. For example, during manufacture or shipment of the semiconductor device 1, the firmware program is stored in the NAND memory 20 in advance. The control unit 101 loads the firmware program from the NAND memory 20 in the RAM 104 in the memory controller 10 at the time of starting the semiconductor device 1. The control unit 101 implements various functions by executing the firmware program loaded in the RAM 14.

In this manner, some or all of the functions of the control unit 101 are implemented by, for example, the CPU that executes firmware. However, some or all of the functions of the control unit 101 may be implemented by a hardware circuit instead of the CPU that executes the firmware.

The control unit 101 controls each component of the semiconductor device 1. When the control unit 101 receives a request from the host HST via the host I/F circuit 102, the control unit 101 performs control according to the request. For example, the control unit 101 instructs the memory I/F circuit 103 to write the data to the NAND memory 20 according to the write request from the host HST. In addition, the control unit 101 instructs the memory I/F circuit 103 to read the data from the NAND memory 20 according to the read request from the host HST. In addition, the control unit 101 instructs the memory I/F circuit 103 to erase the data stored in the NAND memory 20.

The RAM 104 is, for example, a general-purpose memory such as a static random access memory (SRAM) or a dynamic random access memory (DRAM), and is used as a work area of the control unit 101 configured as, for example, a CPU.

Example of Physical Configuration of Semiconductor Device

Figure 2A:
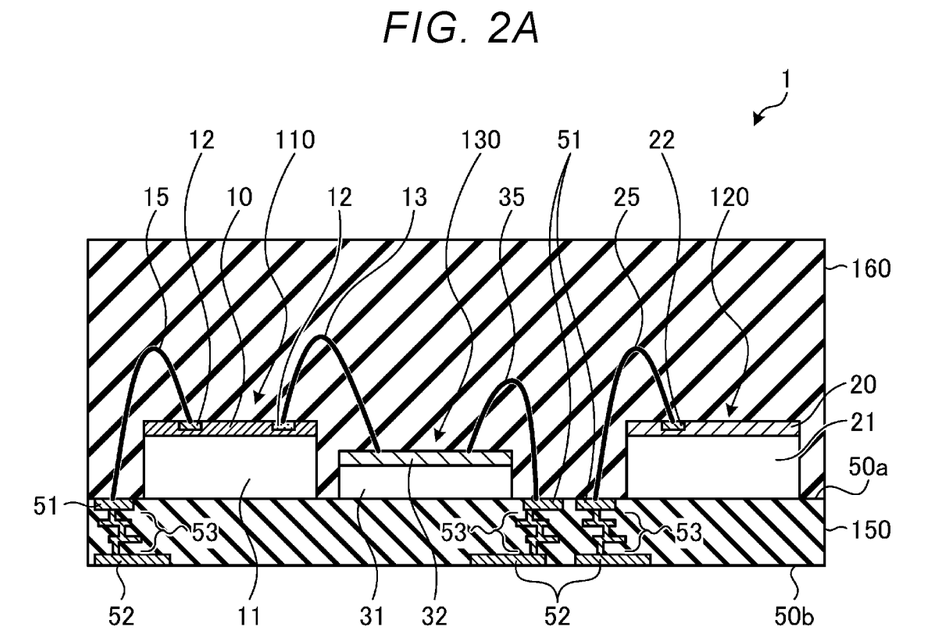
FIGS. 2A to 2C are diagrams illustrating an example of a physical configuration of the semiconductor device according to the first embodiment.
Figure 2B:
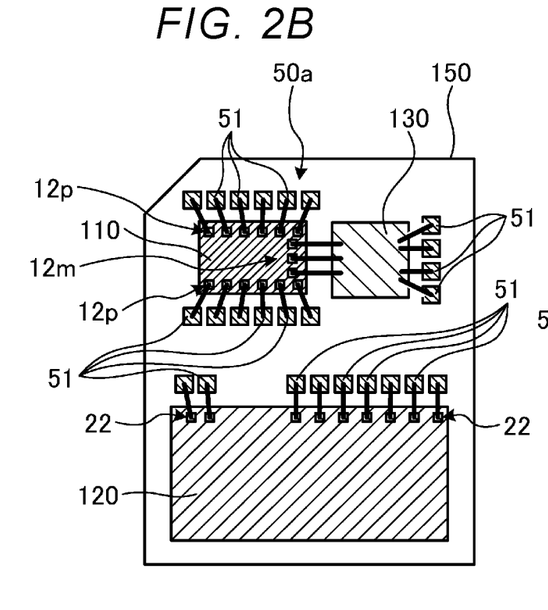
Figure 2C:
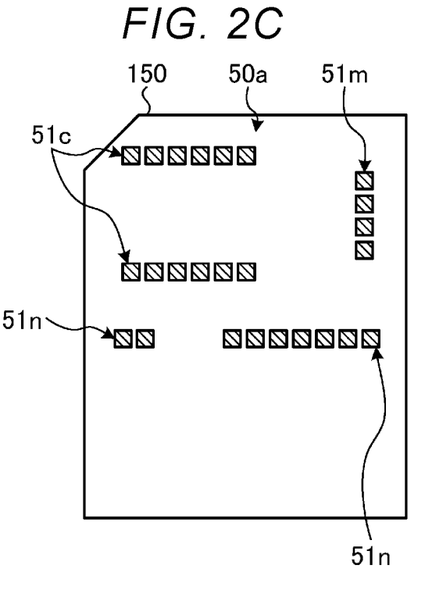

FIGS. 2A to 2C are diagrams illustrating an example of a physical configuration of the semiconductor device 1 according to the first embodiment. FIG. 2A is a cross-sectional view of the semiconductor device 1. FIG. 2B is a plan view of the semiconductor device 1 in which a sealing resin 160 in the semiconductor device 1 is omitted. FIG. 2C is a plan view of a printed circuit board 150 in the semiconductor device 1.

As illustrated in FIG. 2A, the semiconductor device 1 includes a controller chip 110, a memory chip 120, a dummy chip 130, the printed circuit board 150, and the sealing resin 160.

The printed circuit board (PCB) 150 is a premade package board in which various interconnections are formed on a base material made of, for example, a polyimide resin or an epoxy resin. The printed circuit board 150 includes a main surface 50a and a main surface 50b located on the opposite side of the main surface 50a. In the present specification, the direction in which the main surface 50a of the printed circuit board 150 faces is the upward direction.

The printed circuit board 150 includes electrode pads 51 on the main surface 50a. The controller chip 110, the memory chip 120, and the dummy chip 130 are directly or indirectly connected to the plurality of electrode pads 51.

In addition, the printed circuit board 150 includes electrode pads 52 on the main surface 50b. Terminals or pins on the host HST side are connected to the plurality of electrode pads 52. Assuming that the semiconductor device 1 is, for example, a memory card. In this case, when the semiconductor device 1 is inserted into a socket or the like on the host HST side, a plurality of pins on the host HST side are connected to the corresponding electrode pads 52.

One of the electrode pads 52 is connected to a signal line, a power supply line, or the like via a terminal or a pin on the host HST side. Another one of the electrode pads 52 may be connected to a ground line or the like via the terminal or the pin on the host HST side. The signal line transmits and receives the above-mentioned various signals, for example, between the memory controller 10 and the host HST. The power supply line supplies power to, for example, the memory controller 10 and the NAND memory 20. For the ground line, for example, predetermined interconnections of the memory controller 10 and the NAND memory 20 are set to a ground potential.

Interconnections 53 including vias and the like are formed inside the printed circuit board 150. Each of the plurality of electrode pads 52 is connected to at least one of the plurality of electrode pads 51 by these interconnections 53.

The controller chip 110 is disposed on the main surface 50a side of the printed circuit board 150. More specifically, the controller chip 110 is fixed to the main surface 50a of the printed circuit board 150 with, for example, an adhesive or the like. The controller chip 110 includes a substrate 11 and the memory controller 10.

The substrate 11 is a semiconductor substrate such as a silicon substrate and is disposed on the printed circuit board 150. The memory controller 10 is disposed on the substrate 11. That is, the memory controller 10 is an integrated circuit or the like provided on the substrate 11 by using, for example, a method for manufacturing a semiconductor device. Also, electrode pads 12 are arranged on the substrate 11. As described later, the electrode pad 12 is directly or indirectly connected to any of the electrode pads 51 of the printed circuit board 150.

The memory chip 120 is disposed on the main surface 50a side of the printed circuit board 150. More specifically, the memory chip 120 is fixed to the main surface 50a of the printed circuit board 150 with, for example, an adhesive or the like. The memory chip 120 includes a substrate 21 and the NAND memory 20.

The substrate 21 is a semiconductor substrate such as a silicon substrate, which is disposed on the printed circuit board 150 to support the NAND memory 20. The NAND memory 20 is disposed on the substrate 21. That is, the NAND memory 20 is, for example, an integrated circuit provided on the substrate 21 by using a method for manufacturing a semiconductor device. Also, electrode pads 22 may be arranged on the substrate 21. As described later, the electrode pad 22 is directly connected to any of the electrode pads 51 of the printed circuit board 150.

The dummy chip 130 is disposed on the main surface 50a side of the printed circuit board 150. More specifically, the dummy chip 130 is fixed to the main surface 50a of the printed circuit board 150 with, for example, an adhesive or the like. The dummy chip 130 includes a substrate 31 and a metal film 32.

For example, the substrate 31 is a semiconductor substrate such as a silicon substrate and is disposed on the printed circuit board 150 to support the metal film 32. The metal film 32 is disposed on the substrate 31 containing, for example, a material having a higher thermal conductivity than the material configuring the controller chip 110.

As an example, the metal film 32 contains at least one type of metal, and more specifically, at least one of silver, copper, gold, and aluminum. These metals may be the main components of the metal film 32. On the other hand, the controller chip 110 is mostly composed of the substrate 11, such as a silicon substrate. In addition, although the memory controller 10 of the controller chip 110 has interconnections made of conductive metals and the like, a large amount of insulating materials for insulating these interconnections are contained in the controller chip 110. For this reason, for example, the metal film 32 containing a material of which the main component is a metal has a higher thermal conductivity than silicon contained in the controller chip 110 and an insulating member or the like.

As described later, the metal film 32 is connected to any of the electrode pads 51 of the printed circuit board 150.

It is noted that the dummy chip 130 is formed by applying, for example, the method of manufacturing the controller chip 110 and the memory chip 120. As an example, the metal film 32 is formed by performing sputtering, chemical vapor deposition (CVD), and the like of a desired metal on an entire wafer such as a silicon wafer. By dicing this silicon wafer to a desired size, the dummy chip 130 is obtained.

The sealing resin 160 seals the controller chip 110, the memory chip 120, and the dummy chip 130. However, the sealing member may be, for example, a hollow plastic case.

Herein, the controller chip 110 is directly connected to the printed circuit board 150 via a wiring 15. That is, the wiring 15 connects at least one of the plurality of electrode pads 12 and at least one of the plurality of electrode pads 51 of the printed circuit board 150.

In addition, the controller chip 110 is indirectly connected to the printed circuit board 150 via a wiring 13. The dummy chip 130 is directly connected to the printed circuit board 150 via a wiring 35. That is, the wiring 13 connects at least one of the plurality of electrode pads 12 and the metal film 32 of the dummy chip 130. Accordingly, the controller chip 110 is connected to the dummy chip 130. The wiring 35 connects the metal film 32 and at least one of the plurality of electrode pads 51 of the printed circuit board 150. Accordingly, the controller chip 110 is connected to the printed circuit board 150 via the dummy chip 130.

In addition, the memory chip 120 is directly connected to the printed circuit board 150 via the wiring 25. That is, the wiring 25 connects at least one of the plurality of electrode pads 22 and at least one of the plurality of electrode pads 51 of the printed circuit board 150.

The wirings 13, 15, 25, and 35 are made of at least one metal including copper, gold, and aluminum, and have a diameter of, for example, 15 µm or more and 18 µm or less. It is preferable that all the wirings 13, 15, 25, and 35 have the same diameter, for example, regardless of whether the wirings are used for any of signal transmission, power supply, and ground potential adjustment. Accordingly, the formation of the wirings 13, 15, 25, and 35 is facilitated. FIGS. 2B and 2C illustrate a state where the electrode pads 12, 22, 51 and the metal film 32 are connected to each other by the wirings 13, 15, 25, and 35.

As illustrated in FIGS. 2B and 2C, each of the wirings 13, 15, 25, and 35 may be a plurality.

In addition, the plurality of electrode pads 51 in the printed circuit board 150 can be divided into an electrode pad group 51c to which the controller chip 110 is directly connected via the wiring 15, an electrode pad group 51m to which the controller chip 110 is indirectly connected via the wirings 13 and 35, and an electrode pad group 51n to which the memory chip 120 is directly connected via the wiring 25. It can be said that the electrode pad group 51m is an electrode pad group to which the dummy chip 130 is directly connected via the wiring 35. The electrode pad group 51m is disposed at a position separated from, for example, the electrode pad group 51c so that the controller chip 110 and the printed circuit board 150 can be connected via the dummy chip 130.

Any of the plurality of electrode pads 51 in these electrode pad groups 51c, 51m, and 51n is connected to the signal line, the power supply line, ground line, and the like on the host HST side as described above. It is preferable that the electrode pad group 51m includes a larger number of electrode pads 51 to be connected to the power supply line.

In addition, among the plurality of electrode pads 51 in the printed circuit board 150, the total number of pads in the electrode pad groups 51c and 51m may be 20 or more and 30 or less. That is, among the plurality of electrode pads 51 in the printed circuit board 150, the number of electrode pads 51 directly or indirectly connected to the controller chip 110 is, for example, 20 or more and 30 or less.

In other words, the number of electrode pads 12 in the controller chip 110 is, for example, 20 or more and 30 or less. The size of the controller chip 110 is, for example, several millimeters square. Therefore, a total of 20 or more wirings 15 and 13 are connected to such a small controller chip 110.

It is noted that the plurality of electrode pads 12 in the controller chip 110 also include an electrode pad group 12p connected to the printed circuit board 150 and an electrode pad group 12m connected to the dummy chip 130. The electrode pads 12p and 12m are disposed, for example, at positions separated from each other, so that some electrode pads 12 of the controller chip 110 can be directly connected to the printed circuit board 150 and the other electrode pads 12 can be connected to the dummy chip 130.

In addition, the number of electrode pads 22 in the memory chip 120 may be, for example, 20 or more and 30 or less, similarly to the electrode pads 12 in the controller chip 110. Therefore, among the plurality of electrode pads 51 in the printed circuit board 150, the number of electrode pads 51 to which the memory chip 120 is connected may also be 20 or more and 30 or less.

The size of the memory chip 120 is also, for example, several millimeters square. Therefore, 20 or more wirings 25 are connected to such a small memory chip 120.

It is noted that the dummy chip 130 has, for example, the same size as the controller chip 110 or the memory chip 120. However, it is preferable that the dummy chip 130 has a maximum size that is allowed for the main surface 50a of the printed circuit board 150. Accordingly, the area of the metal film 32 disposed on the dummy chip 130 can be made as large as possible.

Comparative Example

There is an increasing demand for high-speed operation in semiconductor devices configured as memory cards and the like. For this reason, a communication speed between a memory controller and a host is increased, and for example, heat generated by a controller chip is significant.

In a semiconductor device of a comparative example, for example, the controller chip is directly connected to the printed circuit board. For this reason, the heat from the controller chip is mainly dissipated from a back surface side of the printed circuit board, that is, the surface opposite to an installation surface of the controller chip through members having a high thermal conductivity such as electrode pads and wirings. On the other hand, the sealing member such as a sealing resin or a plastic case has a low thermal conductivity, and an amount of heat dissipated from the sealing member side is very small.

Therefore, when the amount of heat dissipated from the printed circuit board side is not sufficient, the heat of the controller chip is likely to be trapped in the sealing member. In such a case, in order to ensure the safety of the semiconductor device, for example, a thermal throttling function that limits the operating speed of the semiconductor device may be executed, which reduces the operating performance of the semiconductor device.

According to the semiconductor device 1 of the first embodiment, the controller chip 110 is connected to the dummy chip 130 via the wiring 13, and the dummy chip 130 is connected to the printed circuit board 150 via the wiring 35.

Accordingly, the heat of the controller chip 110 is dissipated from the electrode pad 12 of the controller chip 110 via the wiring 15 and the electrode pads 51 and 52 of the printed circuit board 150, and the heat of the controller chip 110 is dissipated from the electrode pad 12 via the wiring 13, the metal film 32, and the electrode pads 51 and 52 of the printed circuit board 150.

Herein, for example, the size of the dummy chip 130 is made as large as possible. Therefore, the heat dissipation from the controller chip 110 is more easily achieved via the metal film 32 having a high thermal conductivity and a large surface area. Therefore, it is possible to prevent a temperature rise of the controller chip 110.

According to the semiconductor device 1 of the first embodiment, the printed circuit board 150 includes 20 or more and 30 or less electrode pads 51 which are directly or indirectly connected to the controller chip 110. That is, when the wirings 15 are provided in the controller chip 110, 20 or more wirings 15, 13 are integrally connected in a narrow area of, for example, several millimeters square.

Although the wirings 15, 13, and the like are thin wirings having a diameter of, for example, 15 μm or more and 18 μm or less, the heat dissipation from the controller chip 110 is achieved by the wirings 15, 13 connected to the controller chip 110 at a high density, and it is possible to prevent the temperature rise of the controller chip 110.

According to the semiconductor device 1 of the first embodiment, the plurality of electrode pads 51 of the printed circuit board 150 include electrode pad groups 51c, 51m and the like. Accordingly, the controller chip 110 and the printed circuit board 150 can be connected to each other via the dummy chip 130, for example, by disposing the electrode pad groups 51c and 51m at positions separated from each other.

According to the semiconductor device 1 of the first embodiment, the plurality of electrode pads 12 of the controller chip 110 include the electrode pad groups 12p and 12m. Accordingly, it is possible to connect the controller chip 110 to both the printed circuit board 150 and the dummy chip 130, for example, by arranging the electrode pad groups 12p and 12m at positions separated from each other.

According to the semiconductor device 1 of the first embodiment, similarly to the controller chip 110 and the memory chip 120, the dummy chip 130 has the metal film 32 disposed on the substrate 31 such as a silicon substrate. With such a configuration of the dummy chip 130, for example, the dummy chip 130 can be formed by applying the method of manufacturing the controller chip 110 and the memory chip 120. Therefore, it is possible to easily form the dummy chip 130.

According to the semiconductor device 1 of the first embodiment, the metal film 32 contains, for example, at least one of silver, copper, gold, and aluminum. All of these metals have a high thermal conductivity. Therefore, the heat dissipation from the controller chip 110 can be achieved through the metal film 32.

According to the semiconductor device 1 of the first embodiment, the wirings 13, 15, 35 and the like contain at least one metal including copper, gold, and aluminum. All of these materials have a high thermal conductivity. Therefore, the heat from the controller chip 110 can be transferred to the metal film 32 and the printed circuit board 150 via the wirings 13, 15, 35, and the like, and it is possible to prevent the temperature rise of the controller chip 110.

According to the semiconductor device 1 of the first embodiment, among the electrode pad groups 51c, 51m, 51n in the printed circuit board 150, the electrode pad group 51m includes many more electrode pads 51 connected to, for example, the power supply line on the host HST side. A power path in which power is supplied from the host HST side to the controller chip 110 is more likely to cause heat generation of the controller chip 110. Therefore, by interposing the dummy chip 130 that enhances the heat dissipation effect in the power path, it is possible to further prevent the temperature rise of the controller chip 110.

Modification

Next, a semiconductor device 1a of a modification of the first embodiment will be described with reference to FIGS. 3A to 3C. The semiconductor device 1a of the modification includes a dummy chip 230 having a configuration different from that of the first embodiment described above. However, the semiconductor device 1a of the modification has a functional configuration similar to that of the semiconductor device 1 of the first embodiment described above.

As described below, in the semiconductor device 1a of the modification, the configurations similar to those of the semiconductor device 1 of the first embodiment described above are denoted by the same reference numerals, and the description thereof may be omitted.

Figure 3A:
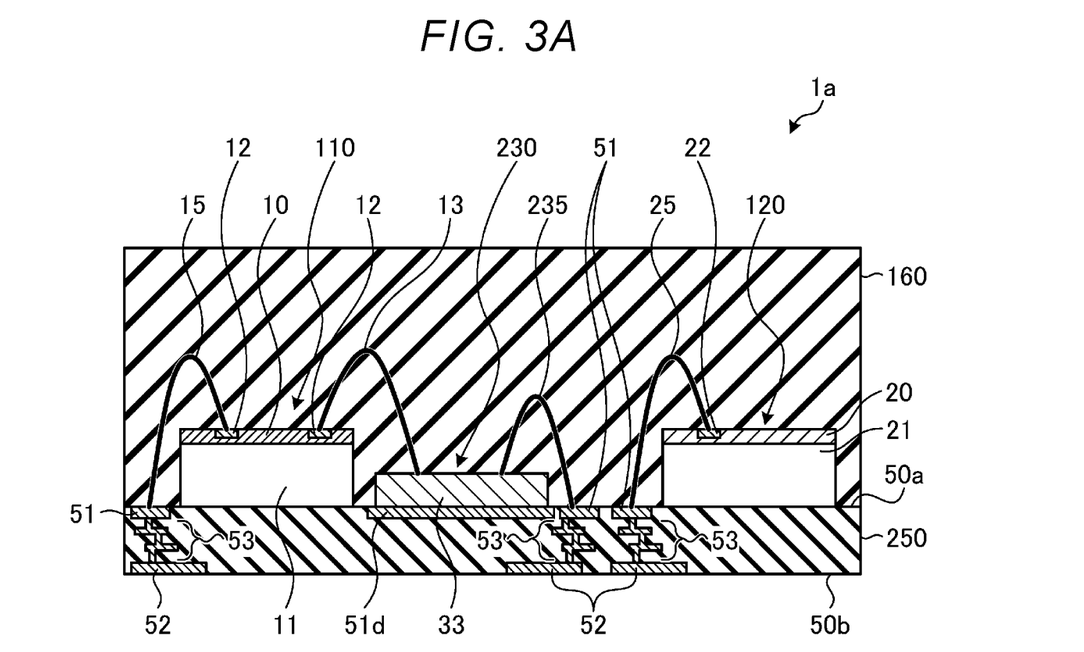
FIGS. 3A to 3C are diagrams illustrating an example of a physical configuration of a semiconductor device according to a modification of the first embodiment.
Figure 3B:
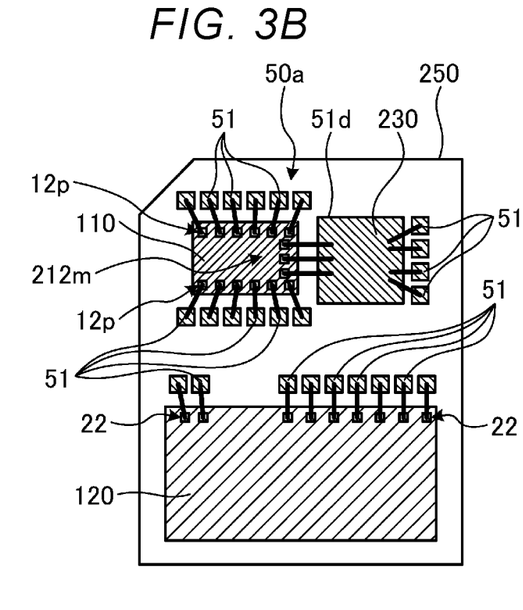
Figure 3C:
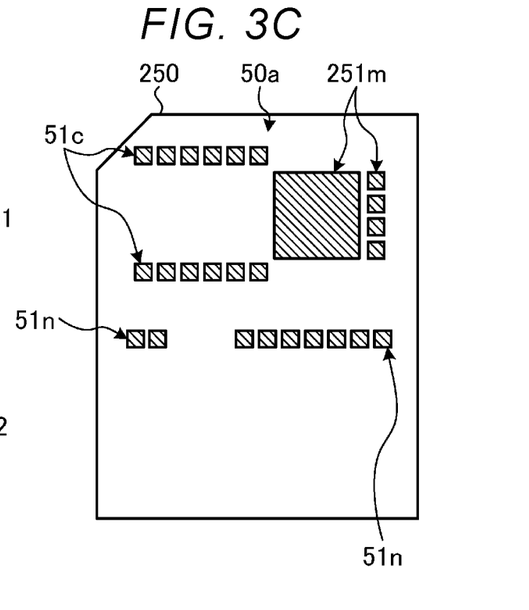

FIGS. 3A to 3C are diagrams illustrating an example of a physical configuration of the semiconductor device 1a according to the modification of the first embodiment. FIG. 3A is a cross-sectional view of the semiconductor device 1a. FIG. 3B is a plan view of the semiconductor device 1a in which a sealing resin 160 in the semiconductor device 1a is omitted. FIG. 3C is a plan view of a printed circuit board 250 in the semiconductor device 1a.

As illustrated in FIG. 3A, the semiconductor device 1a includes the printed circuit board 250 instead of the printed circuit board 150 described above. The printed circuit board 250 has a configuration similar to that of printed circuit board 150 of the first embodiment described above, except that the plurality of electrode pads 51 include a dummy pad 51d.

The dummy pad 51d is disposed on the main surface 50a of the printed circuit board 250 and is not connected to any of the plurality of electrode pads 52 arranged on the main surface 50b of the printed circuit board 250. The dummy pad 51d has at least a larger area than the other electrode pads 51. It is preferable that the dummy pad 51d has, for example, an area equal to the size of the dummy chip 230 or an area larger than the size of the dummy chip 230.

In addition, the semiconductor device 1a includes the dummy chip 230 instead of the dummy chip 130 described above.

The dummy chip 230 is disposed on the main surface 50a side of the printed circuit board 250. More specifically, the dummy chip 230 is fixed to the dummy pad 51d of the printed circuit board 250 with, for example, an adhesive or the like. When the dummy pad 51d has, for example, an area equal to or larger than that of the dummy chip 230, so as to be in a state where the entire back surface of the dummy chip 230 is in contact with the dummy pad 51d. It is noted that the adhesive preferably has thermal conductivity. The dummy chip 230 includes a substrate 33.

The substrate 33 includes, for example, a material having a higher thermal conductivity than the material configuring the controller chip 110.

As an example, the substrate 33 contains at least one metal, more specifically at least one of silver, copper, gold, and aluminum. These metals may be the main components of the substrate 33. For example, the substrate 33 containing a material of which main component is a metal has a higher thermal conductivity than the material of the controller chip 110.

Such a dummy chip 230 is formed by, for example, cutting a flat plate or the like containing a desired metal into chips having a desired size by machining or the like.

The dummy chip 230 is directly connected to any of the electrode pads 51 of the printed circuit board 250 via a wiring 235. That is, the wiring 235 as the second wiring connects the substrate 33 of the dummy chip 230 and at least one of the plurality of electrode pads 51 of the printed circuit board 250. Accordingly, the controller chip 110 is connected to the printed circuit board 250 via the dummy chip 230.

FIGS. 3B and 3C illustrate a state where the electrode pads 12, 51, 51d and the like are connected to each other by the substrate 33 of the dummy chip 230 and the wiring 235 and the like.

As illustrated in FIGS. 3B and 3C, the number of wirings 235 may be plural.

The plurality of electrode pads 51 and the dummy pad 51d in the printed circuit board 250 can be divided into an electrode pad group 251m in addition to the electrode pad groups 51c and 51n. The electrode pad group 251m includes the electrode pads 51 to which the controller chip 110 is indirectly connected via the wirings 13 and 235 and the dummy pad 51d to which the dummy chip 230 is directly connected by placing the dummy chip 230. That is, it can be said that the electrode pad group 251m is an electrode pad group to which the dummy chip 230 is directly or indirectly connected.

Among the electrode pad group 251m, the electrode pads 51 to which the dummy chip 230 is connected via the wiring 235 are arranged at positions separated from, for example, the electrode pad group 51c. Accordingly, the controller chip 110 and the printed circuit board 250 can be connected via the dummy chip 230.

Among the electrode pad group 251m, the dummy pad 51d to which the dummy chip 230 is directly connected is disposed at a position where the dummy chip 230 is mounted, for example, at a position separated from the electrode pad group 51c on the main surface 50a of the printed circuit board 250. In other words, the mounting position of the dummy chip 230 on the printed circuit board 250 is defined by the position of the dummy pad 51d on the main surface 50a of the printed circuit board 250.

In addition, the plurality of electrode pads 12 in the controller chip 110 include an electrode pad group 12p connected to the printed circuit board 250 and an electrode pad group 212m connected to the dummy chip 230. The electrode pad groups 12p and 212m are disposed, for example, at positions separated from each other. Accordingly, some electrode pads 12 of the controller chip 110 can be directly connected to the printed circuit board 250, and the other electrode pads 12 can be connected to the dummy chip 230.

According to the semiconductor device 1a of the modification, effects similar to the one or more effects of the semiconductor device 1 of the first embodiment described above are obtained.

According to the semiconductor device 1a of the modification, the substrate 33 in the dummy chip 230 includes, for example, a material having a higher thermal conductivity than the material configuring the controller chip 110. As described above, since the substrate 33 itself having a larger volume has a high thermal conductivity, the amount of heat that can be received from the controller chip 110 is increased, and the heat dissipation of the controller chip 110 can be further prompted.

According to the semiconductor device 1a of the modification, the dummy chip 230 is disposed on the dummy pad 51d. Accordingly, since the heat transferred from the controller chip 110 to the dummy chip 230 is dissipated to the printed circuit board 250 side even via the dummy pad 51d having a larger area than the other electrode pads 51, the heat dissipation effect from the controller chip 110 can be further improved.

Second Embodiment

Hereinafter, a second embodiment will be described in detail with reference to the drawings. In the semiconductor device of the second embodiment, the arrangement of a controller chip and a dummy chip on a printed circuit board is different from that of the first embodiment. However, the semiconductor device of the second embodiment has a functional configuration similar to that of the semiconductor device 1 of the first embodiment described above.

Example of Physical Configuration of Semiconductor Device

Figure 4A:
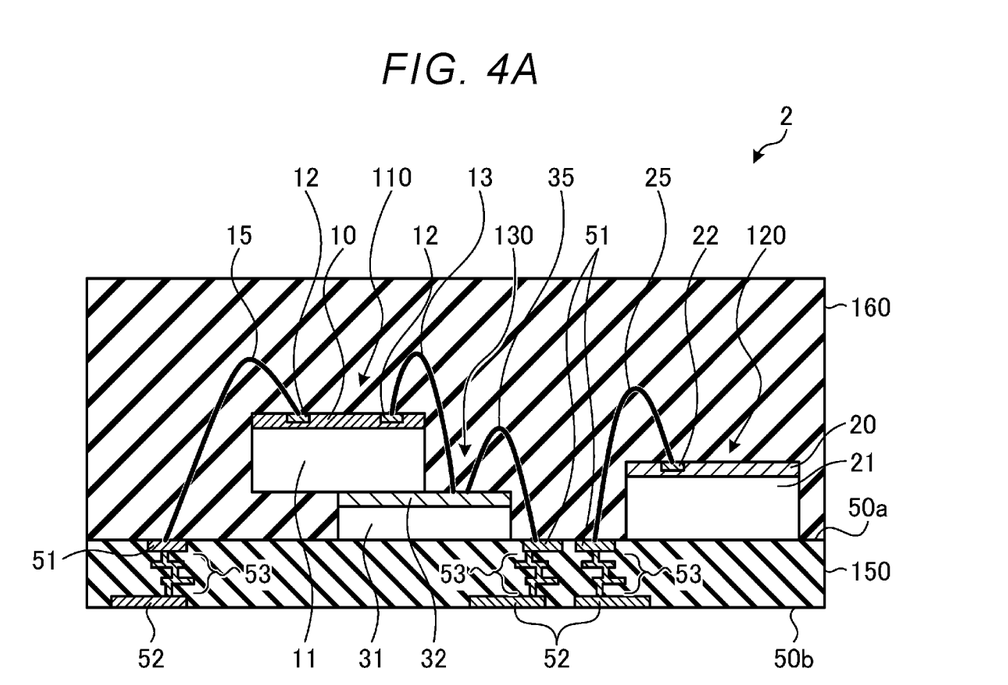
FIGS. 4A to 4C are diagrams illustrating an example of a physical configuration of a semiconductor device according to a second embodiment.
Figure 4B:
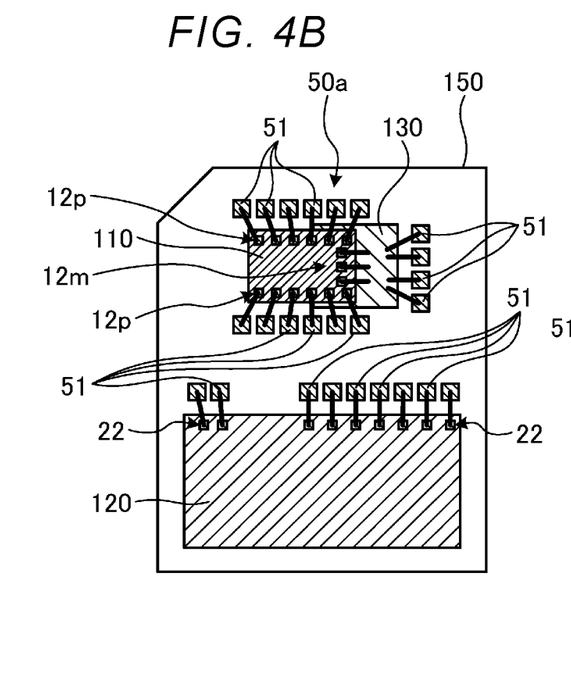
Figure 4C:
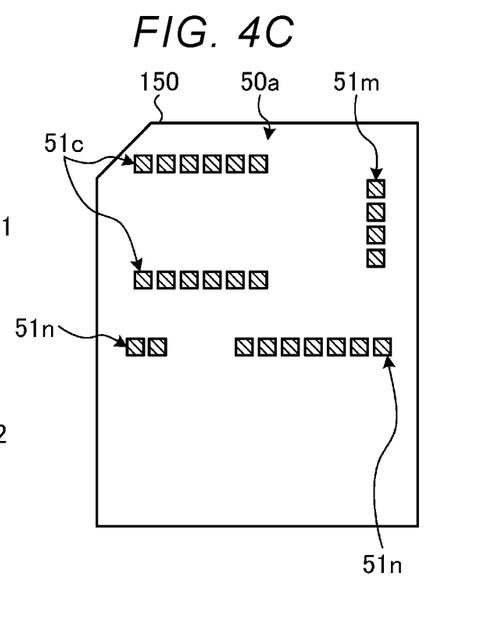

FIGS. 4A to 4C are diagrams illustrating an example of a physical configuration of a semiconductor device 2 according to the second embodiment. FIG. 4A is a cross-sectional view of the semiconductor device 2. FIG. 4B is a plan view of the semiconductor device 2 in which a sealing resin 160 in the semiconductor device 2 is omitted. FIG. 4C is a plan view of a printed circuit board 150 in the semiconductor device 2.

As illustrated in FIG. 4A, the configuration in the semiconductor device 2 of the second embodiment is similar to, for example, the configuration in the semiconductor device 1 of the first embodiment described above. In the semiconductor device 2 of the second embodiment, the controller chip 110 and the dummy chip 130 are stacked on the printed circuit board 150.

That is, the dummy chip 130 is disposed on the printed circuit board 150, and the controller chip 110 is disposed on the dummy chip 130. The dummy chip 130 is fixed to the main surface 50a of the printed circuit board 150 with, for example, an adhesive or the like. The controller chip 110 is fixed on the metal film 32 of the dummy chip 130 with, for example, an adhesive or the like.

The controller chip 110 is disposed, for example, at a position slightly shifted from directly above the dummy chip 130 in the horizontal direction so as not to completely cover the metal film 32. Alternatively, for example, the dummy chip 130 has a size larger than that of the controller chip 110 so that the controller chip 110 may be disposed on the dummy chip 130 without the controller chip 110 protruding from the dummy chip 130 and without the controller chip 110 completely covering the metal film 32.

Herein, the second embodiment is similar to the first embodiment described above in terms of the point that the wiring 13 connects the electrode pad 12 of the controller chip 110 and the metal film 32 of the dummy chip 130, and the wiring 35 connects the metal film 32 and the electrode pad 51 of the printed circuit board 150. The wiring 13 extends to the dummy chip 130 disposed below the controller chip 110 and is connected to the metal film 32.

FIGS. 4B and 4C illustrate a state where the electrode pads 12 and 51, the metal film 32, and the like are connected to each other by the wirings 13, 35, and the like.

As illustrated in FIGS. 4B and 4C, among the plurality of electrode pads 51 in the printed circuit board 150, the electrode pad groups 51c and 51m are disposed, for example, to be separated from each other. However, since at least portions of the controller chip 110 and the dummy chip 130 overlap each other, the electrode pad groups 51c and 51m may be disposed closer to each other than in the case of the first embodiment described above.

As described above, in the semiconductor device 2 of the second embodiment, even when the electrode pad groups 51c and 51m are slightly closer to each other, the controller chip 110 and the printed circuit board 150 can be connected to each other via the dummy chip 130.

According to the semiconductor device 2 of the second embodiment, effects similar to those of the semiconductor device 1 of the first embodiment are obtained.

According to the semiconductor device 2 of the second embodiment, the controller chip 110 and the dummy chip 130 are stacked on the printed circuit board 150.

Accordingly, for example, even when the main surface 50a of the printed circuit board 150 does not have a sufficient space, the controller chip 110 and the dummy chip 130 can be disposed in a space-saving manner.

Alternatively, by saving space between the controller chip 110 and the dummy chip 130, the size of the printed circuit board 150 can be decreased to reduce the size of the semiconductor device 2, or the size of the dummy chip 130 can be increased to further improve the heat dissipation effect.

First Modification

Next, a semiconductor device 2a of a first modification of the second embodiment will be described with reference to FIGS. 5A to 5C. The semiconductor device 2a of the first modification includes the dummy chip 230 having a configuration different from that of the second embodiment described above.

Figure 5A:
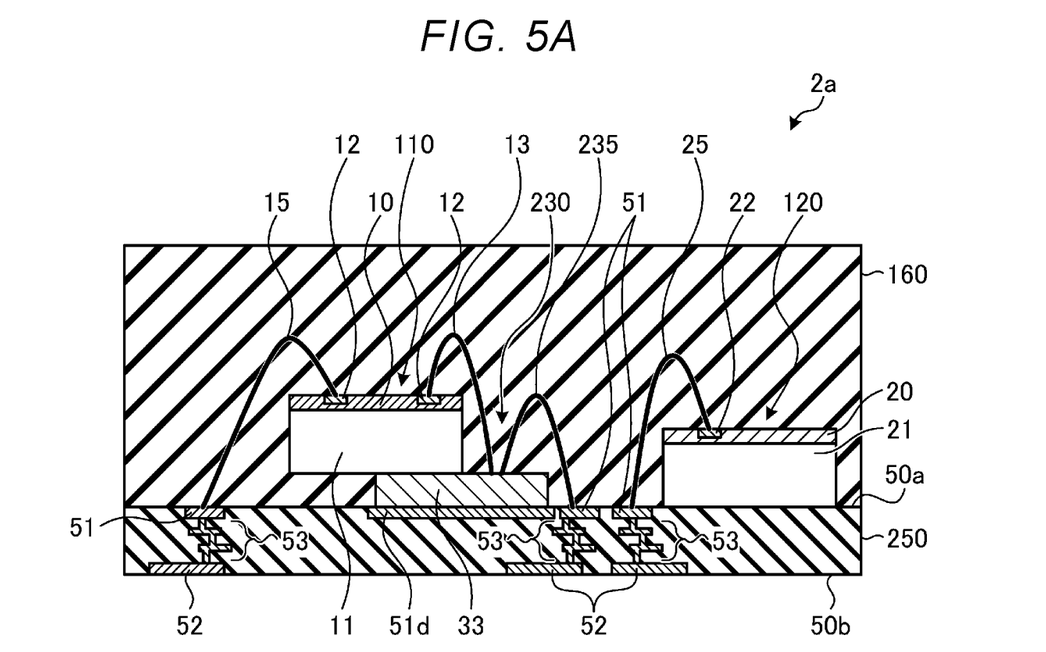
FIGS. 5A to 5C are diagrams illustrating an example of a physical configuration of a semiconductor device according to a first modification of the second embodiment.
Figure 5B:
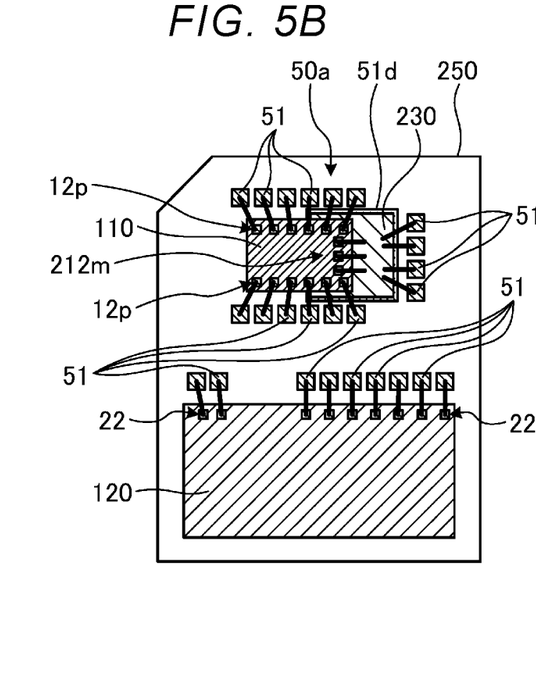
Figure 5C:
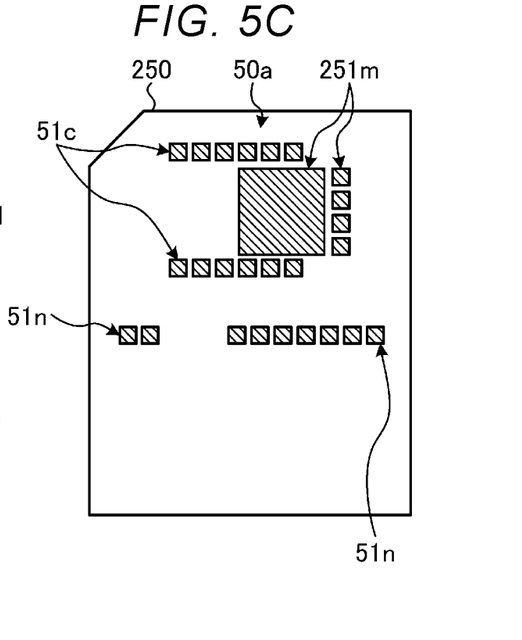

FIGS. 5A to 5C are diagrams illustrating an example of a physical configuration of the semiconductor device 2a according to the first modification of the second embodiment. FIG. 5A is a cross-sectional view of the semiconductor device 2a. FIG. 5B is a plan view of the semiconductor device 2a in which a sealing resin 160 in the semiconductor device 2a is omitted. FIG. 5C is a plan view of a printed circuit board 250 in the semiconductor device 2a.

As illustrated in FIG. 5A, even in the configuration in which the controller chip 110 and the like are stacked, similarly to the modification of the first embodiment described above, the dummy chips 230 may be used instead of the dummy chips 130 described above. That is, the configuration in the semiconductor device 2a of the modification 1 is similar to, for example, the configuration in the semiconductor device 1a of the modification of the first embodiment described above.

In the semiconductor device 2a of the first modification, the dummy chip 230 is disposed on the printed circuit board 250, and the controller chip 110 is disposed on the dummy chip 230. The dummy chip 230 is fixed to a dummy pad 51d disposed on the main surface 50a of the printed circuit board 250 with, for example, an adhesive or the like. The adhesive preferably has a thermal conductivity. The controller chip 110 is fixed on the dummy chip 230 with, for example, an adhesive.

The wiring 13 connects the electrode pad 12 of the controller chip 110 and the substrate 33 of the dummy chip 230, and the wiring 235 connects the substrate 33 and the electrode pad 51 of the printed circuit board 250. The wiring 13 extends to the dummy chip 230 disposed below the controller chip 110 and is connected to the substrate 33 of the dummy chip 230.

FIGS. 5B and 5C illustrate a state where the electrode pads 12, 51, 51d, and the like are connected to each other by the substrate 33 of the dummy chip 230 and the wiring 235 and the like.

As illustrated in FIGS. 5B and 5C, among the plurality of electrode pads 51 and dummy pad 51d in the printed circuit board 250, the electrode pad groups 51c and 251m are disposed, for example, to be separated from each other. However, since at least portions of the controller chip 110 and the dummy chip 230 overlap each other, the electrode pad groups 51c and 251m may be disposed closer to each other than in the case of the modification of the first embodiment described above. A portion or all of the dummy pad 51d in the electrode pad group 251m may be located in the region where the electrode pad group 51c is disposed.

As described above, in the semiconductor device 2a of the first modification, even if the electrode pad groups 51c and 251m are slightly closer to each other, the controller chip 110 and the printed circuit board 250 can be connected to each other via the dummy chip 230.

According to the semiconductor device 2a of the modification 1, effects similar to those of the semiconductor device 2 of the second embodiment and the semiconductor device 1a of the modification of the first embodiment are obtained.

Second Modification

Next, a semiconductor device 2b of a second modification of the second embodiment will be described with reference to FIGS. 6A to 6C. In the semiconductor device 2b of the second modification, the arrangement of the controller chip 110 and the dummy chip 130 on the printed circuit board 150 is different from that of the second embodiment.

Figure 6A:
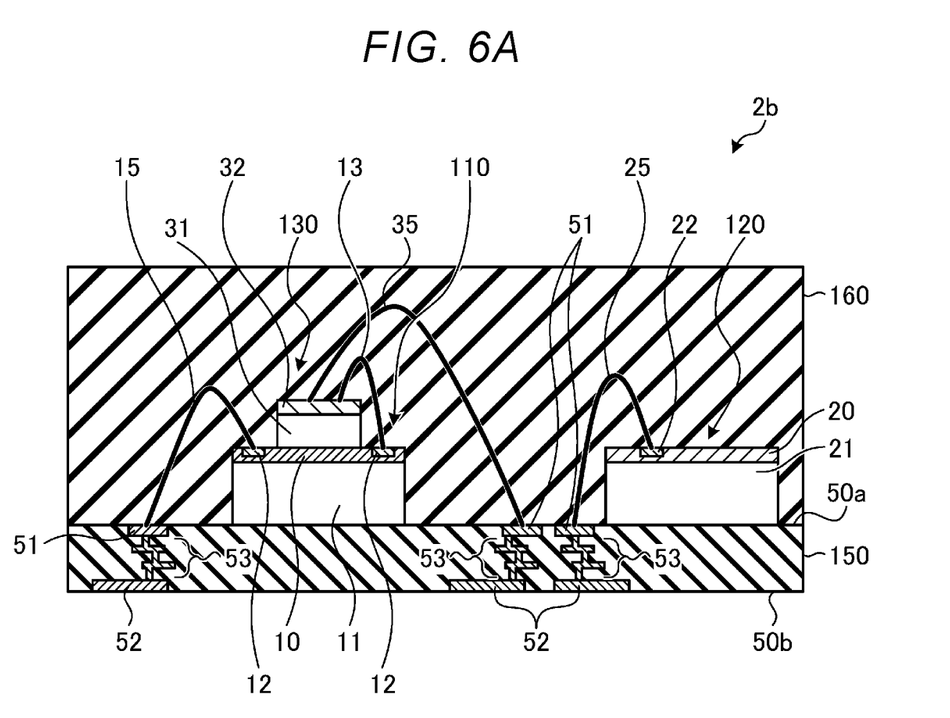
FIGS. 6A to 6C are diagrams illustrating an example of a physical configuration of a semiconductor device according to a second modification of the second embodiment.
Figure 6B:
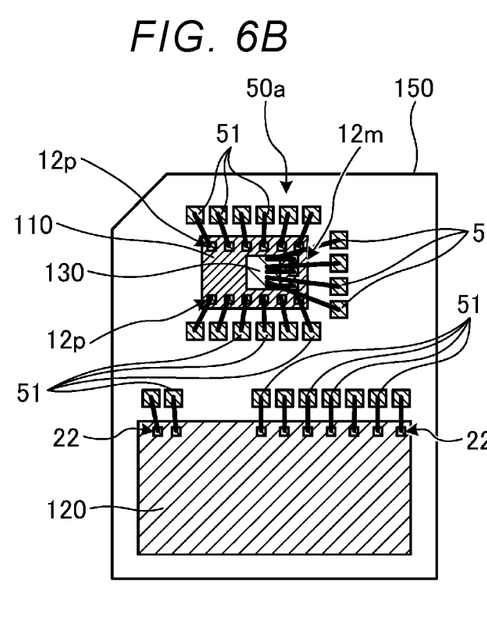
Figure 6C:
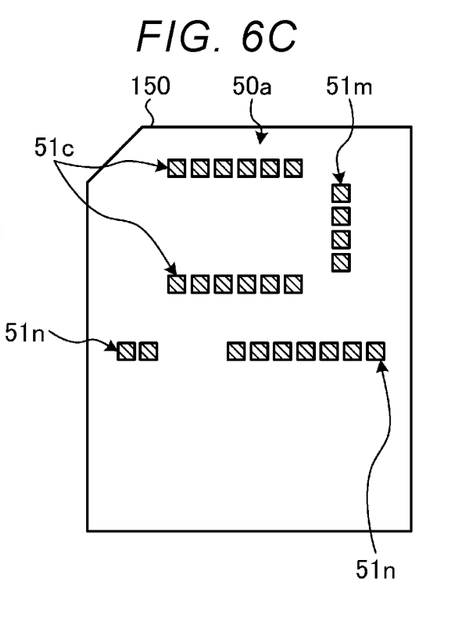

FIGS. 6A to 6C are diagrams illustrating an example of a physical configuration of the semiconductor device 2b according to the second modification of the second embodiment. FIG. 6A is a cross-sectional view of the semiconductor device 2b. FIG. 6B is a plan view of the semiconductor device 2b in which a sealing resin 160 in the semiconductor device 2b is omitted. FIG. 6C is a plan view of a printed circuit board 150 in the semiconductor device 2b.

As illustrated in FIG. 6A, the configuration in the semiconductor device 2b of the second modification is also similar to, for example, the configuration in the first embodiment described above. In addition, similarly to the second embodiment, also in the semiconductor device 2b of the second modification, the controller chip 110 and the dummy chip 130 are stacked on the printed circuit board 150.

However, in the semiconductor device 2b of the second modification, the controller chip 110 is disposed on the printed circuit board 150, and the dummy chip 130 is disposed on the controller chip 110. The controller chip 110 is fixed to the main surface 50a of the printed circuit board 150 with, for example, an adhesive or the like. The dummy chip 130 is fixed on the controller chip 110 with, for example, an adhesive or the like.

The dummy chip 130 has a size smaller than, for example, the controller chip 110. Accordingly, the dummy chip 130 can be disposed on the controller chip 110 without the dummy chip 130 protruding from the controller chip 110 and without the dummy chip 130 covering the electrode pad 12 of the controller chip 110.

Alternatively, when the electrode pad 12 of the controller chip 110 cannot be covered by slightly shifting the dummy chip 130 from directly above the controller chip 110 in the horizontal direction, the dummy chip 130 may be disposed as such.

Herein, the modification is similar to the second embodiment described above in terms of the point that the wiring 13 connects the electrode pad 12 of the controller chip 110 and the metal film 32 of the dummy chip 130, and the wiring 35 connects the metal film 32 and the electrode pad 51 of the printed circuit board 150. At this time, the wiring 13 extends to the dummy chip 130 disposed above the controller chip 110 and is connected to the metal film 32.

FIGS. 6B and 6C illustrate a state where the electrode pads 12 and 51, the metal film 32, and the like are connected to each other by the wirings 13, 35 and the like.

As illustrated in FIGS. 6B and 6C, among the plurality of electrode pads 51 in the printed circuit board 150, the electrode pad groups 51c and 51m are disposed, for example, to be separated from each other. However, when the dummy chip 130 is formed to be smaller than the controller chip 110, the electrode pad groups 51c and 51m may be disposed closer to each other than in the case of the second embodiment described above.

As described above, in the semiconductor device 2b of the second modification, even if the electrode pad groups 51c and 51m are closer to each other, the controller chip 110 and the printed circuit board 150 can be connected to each other via the dummy chip 130.

According to the semiconductor device 2b of the second modification, effects similar to those of the semiconductor device 2 of the second embodiment are obtained.

According to the semiconductor device 2b of the second modification, for example, the dummy chip 130 is smaller than the controller chip 110 and is stacked on the controller chip 110 without protruding from the controller chip 110. Accordingly, the space of the controller chip 110 and the dummy chip 130 can be further reduced.

It is noted that when the controller chip 110 is disposed on the printed circuit board 150 as in the semiconductor device 2b of the second modification, the dummy chip 230 may be used instead of the dummy chip 130. In this case, the dummy chip 230 is fixed to the controller chip 110 with, for example, an adhesive or the like. The adhesive preferably has a thermal conductivity. Accordingly, heat can be dissipated directly from the controller chip 110 to the dummy chip 230, and the heat dissipation efficiency can be further improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a printed circuit board having a plurality of first electrode pads on a first main surface and a plurality of second electrode pads electrically connected to at least one of the plurality of first electrode pads on a second main surface, wherein the first main surface and the second main surface are respectively located on opposite sides of the printed circuit board;
a first chip disposed on the first main surface and having a non-volatile memory;
a second chip having a third electrode pad and a control circuit configured to control an operation of the non-volatile memory;
a dummy chip having a component that has a higher thermal conductivity than a substrate of the second chip; and
a sealing member sealing the first, second, and dummy chips,
wherein the third electrode pad is connected to the component of the dummy chip via a first wiring, and
wherein the component of the dummy chip is connected to one of the plurality of first electrode pads via a second wiring.

2. The semiconductor device according to claim 1, wherein the first chip has a fourth electrode pad that is connected to one of the plurality of first electrode pads via a third wiring.

3. The semiconductor device according to claim 1,
wherein the second chip includes a plurality of third electrode pads, and
wherein one of the plurality of third electrode pads is connected to one of the plurality of first electrode pads via a fourth wiring.

4. The semiconductor device according to claim 1,
wherein the dummy chip is disposed on the printed circuit board, and
wherein the second chip is disposed on the dummy chip.

5. The semiconductor device according to claim 1, wherein both the second chip and the dummy chip are disposed on the printed circuit board.

6. The semiconductor device according to claim 5,
wherein the plurality of first electrode pads includes a dummy pad that is not connected to any of the plurality of second electrode pads, and
wherein the dummy chip is disposed on the dummy pad.

7. The semiconductor device according to claim 1, wherein the dummy chip includes a substrate and the component is disposed on the substrate.

8. The semiconductor device according to claim 7, wherein the first chip has a substrate that supports the non-volatile memory, and the substrate of the second chip supports the control circuit.

9. The semiconductor device according to claim 8, wherein the substrates of the first, second, and dummy chips are semiconductor substrates.

10. The semiconductor device according to claim 1, wherein diameters of the first and second wirings are 15 μm or more and 18 μm or less.

11. A semiconductor device comprising:
a printed circuit board having a plurality of first electrode pads on a first main surface and a plurality of second electrode pads electrically connected to at least one of the plurality of first electrode pads on a second main surface, wherein the first main surface and the second main surface are respectively located on opposite sides of the printed circuit board;
a memory chip including a non-volatile memory on the first main surface;
a controller chip including a control circuit for the non-volatile memory;
a dummy chip;
a first wiring electrically connecting an electrode pad on the controller chip to a conductive upper surface of the dummy chip and a second wiring electrically connecting the conductive upper surface of the dummy chip to one of the plurality of first electrode pads; and
a sealing member sealing the first, second, and dummy chips and the first and second wirings.

12. The semiconductor device according to claim 11, further comprising:
a third wiring electrically connecting an electrode pad on the memory chip to one of the plurality of first electrode pads; and
a fourth wiring electrically connecting another electrode pad on the controller chip to one of the plurality of first electrode pads.

13. The semiconductor device according to claim 11, wherein the dummy chip includes a semiconductor substrate and a metal film on the semiconductor substrate.

14. The semiconductor device according to claim 11, wherein the dummy chip is made entirely of a metal substrate.

15. The semiconductor device according to claim 14, wherein
the plurality of first electrode pads includes a dummy pad that is not connected to any of the plurality of second electrode pads, and
the dummy chip is disposed on the dummy pad.

16. The semiconductor device according to claim 11, wherein the controller chip is disposed on the first main surface and the dummy chip is disposed on the first main surface.

17. The semiconductor device according to claim 11, wherein the dummy chip is disposed on the first main surface and the controller chip is disposed on the dummy chip.

18. The semiconductor device according to claim 11, wherein the controller chip is disposed on the first main surface and the dummy chip is disposed on the controller chip.

19. The semiconductor device according to claim 11, wherein the memory chip includes a semiconductor substrate on which the non-volatile memory is formed and the controller chip includes a semiconductor substrate on which the control circuit is formed.

20. The semiconductor device according to claim 11, wherein diameters of the first and second wirings are 15 μm or more and 18 μm or less.

* * * * *